United States Patent
Maulik et al.

[11] Patent Number: 6,147,631
[45] Date of Patent: Nov. 14, 2000

[54] INPUT SAMPLING STRUCTURE FOR DELTA-SIGMA MODULATOR

[75] Inventors: Prabir C. Maulik; Philip John Crawley, both of Austin, Tex.

[73] Assignee: Cirrus Logic, Inc., Austin, Tex.

[21] Appl. No.: 09/208,712

[22] Filed: Dec. 9, 1998

[51] Int. Cl.$^7$ ................................................. H03M 3/00
[52] U.S. Cl. ........................................... 341/122; 341/143
[58] Field of Search .................................. 341/143, 172, 341/122, 123

[56] References Cited

U.S. PATENT DOCUMENTS

| | | |
|---|---|---|
| 4,584,701 | 4/1986 | Nakama et al. . |
| 5,159,341 | 10/1992 | McCartney et al. ................. 341/143 |
| 5,369,710 | 11/1994 | Asai . |
| 5,555,516 | 9/1996 | Zook . |
| 5,563,819 | 10/1996 | Nelson . |
| 5,592,404 | 1/1997 | Zook . |
| 5,689,571 | 11/1997 | Kitamura . |
| 5,717,619 | 2/1998 | Spurbeck et al. . |
| 5,719,572 | 2/1998 | Gong . |
| 5,719,573 | 2/1998 | Leung et al. . |
| 5,729,229 | 3/1998 | Kasha et al. . |

FOREIGN PATENT DOCUMENTS

| | | |
|---|---|---|
| 0 422 955 | 4/1991 | European Pat. Off. . |
| 0 480 561 | 4/1992 | European Pat. Off. . |
| 8-160982 | 6/1996 | Japan . |
| WO 98/11530 | 3/1998 | WIPO . |

*Primary Examiner*—Brian Young
*Attorney, Agent, or Firm*—Ken J. Koestner; J. P. Violette; Peter T. Rutkowski

[57] ABSTRACT

A signal processing circuit includes a main input sampling structure with an integrator operational amplifier and input lines including a switched capacitor. The input lines have switched connections to input signal lines and reference signal lines. A replica sampling structure is used in combination with the main input sampling structure to eliminate or reduce signal-dependent current that is drawn from the input signal line and the reference signal line. The replica sampler includes buffered input lines and switched capacitor of the input sampling structure but the capacitors have switched connections to the reference signal lines such that the connections have opposite polarity to the connections of the reference signal line to the input sampling structure. The replica sampler eliminates or reduces signal-dependent current from the reference signal lines. Buffering of the input lines in the replica sampler eliminates or reduces the signal-dependent current drawn from the input signal lines. The structure efficiently allows the use of a smaller capacitance for the same performance.

18 Claims, 8 Drawing Sheets

INPUT SAMPLING STRUCTURE FOR DELTA-SIGMA MODULATOR

TECHNICAL FIELD

The present invention relates to signal processing circuits. More specifically, the invention relates to input sampling circuits for usage in various applications including analog-to-digital converters.

BACKGROUND ART

A delta-sigma modulator in a high precision delta-sigma analog-to-digital converter (ADC) is designed to add an analog input signal with a reference voltage at a summing node to generate an analog difference signal. The analog difference signal is integrated and quantized to produce a digital output signal. The digital output signal is then coupled to a digital-to-analog (D/A) converter which selects a reference voltage level between positive $V_{REF+}$ and negative $V_{REF-}$ sources, to apply to the summing node in the next sampling period. The accuracy of the A/D or D/A conversion depends on the accuracy of the reference voltage level.

In a delta-sigma modulator integrated circuit (IC), the reference voltage sources have some measurable impedance since the production of reference voltages with a virtually zero source impedance over the signal frequency range is impractical and cost-prohibitive. If loading on the reference voltage varies with the analog input signal, then the delta-sigma modulator has non-linear errors due to this signal-dependent loading of the reference voltages.

Delta sigma modulator ICs generally have external anti-aliasing networks connected to the input pins. These networks are typically RC filters. Any signal-dependent current drawn by the input pins will cause a voltage drop across the resistance R of the RC filter, thereby causing a gain error.

Thus, what is needed is a delta-sigma modulator that has signal-independent loading of the voltage reference and signal-independent input current.

SUMMARY OF THE INVENTION

The present invention satisfies the above need with a delta-sigma modulator that comprises a main input sampling structure and at least a first replica input sampling structure.

In one embodiment, the main input sampling structure includes an integrator having a positive input terminal and a negative input terminal, an integrator having a positive input terminal and a negative input terminal, a first capacitor, and a first plurality of switches. The first plurality of switches selectively connect the first capacitor to a common mode voltage, the negative input terminal, a first input signal line, a first reference line, and a second reference line. The first replica input sampling structure is coupled to the main input sampling structure. The first replica input sampling structure includes a first buffer connected to the first input signal line which is used in reducing the signal dependent current from the first input signal thereby reducing gain error, a second capacitor, and a second plurality of switches. The second plurality of switches selectively connect the second capacitor to the common mode voltage, the first buffer, and the first and second reference lines such that a signal-dependent current that is drawn from the reference signal lines is cancelled in the main input sampler.

In another embodiment in which the main input sampling structure has fully differential input, the main input sampling structure further includes a third capacitor and a third plurality of switches. The third plurality of switches are used

2 to selectively connect the third capacitor to a common mode voltage, the positive input terminal, a second input signal line, the first reference line, and the second reference line. In this case, a second replica input sampling structure is needed. The second replica input sampling structure is coupled to the main input sampling structure. The second replica input sampling structure comprises a second buffer, a fourth capacitor, and a fourth plurality of switches. The second buffer is connected to the second input signal line to reduce the signal dependent current from the second input signal thereby reducing gain error. The fourth plurality of switches is used to selectively connect the second capacitor to the common mode voltage, the second buffer, and the first and second reference lines such that a signal-dependent current that is drawn from the reference signal lines is cancelled in the main input sampler.

All the features and advantages of the present invention will become apparent from the following detailed description of its preferred embodiment whose description should be taken in conjunction with the accompanying drawings.

BRIEF DESCRIPTION OF DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE PREFERRED EMBODIMENT(S)

In the following detailed description of the present invention, numerous specific details are set forth in order to provide a thorough understanding of the present invention. However, it will be obvious to one skilled in the art that the present invention may be practiced without these specific details. In other instances, well known methods, procedures, components, and circuits have not been described in detail as not to unnecessarily obscure aspects of the present invention.

Figure 1:
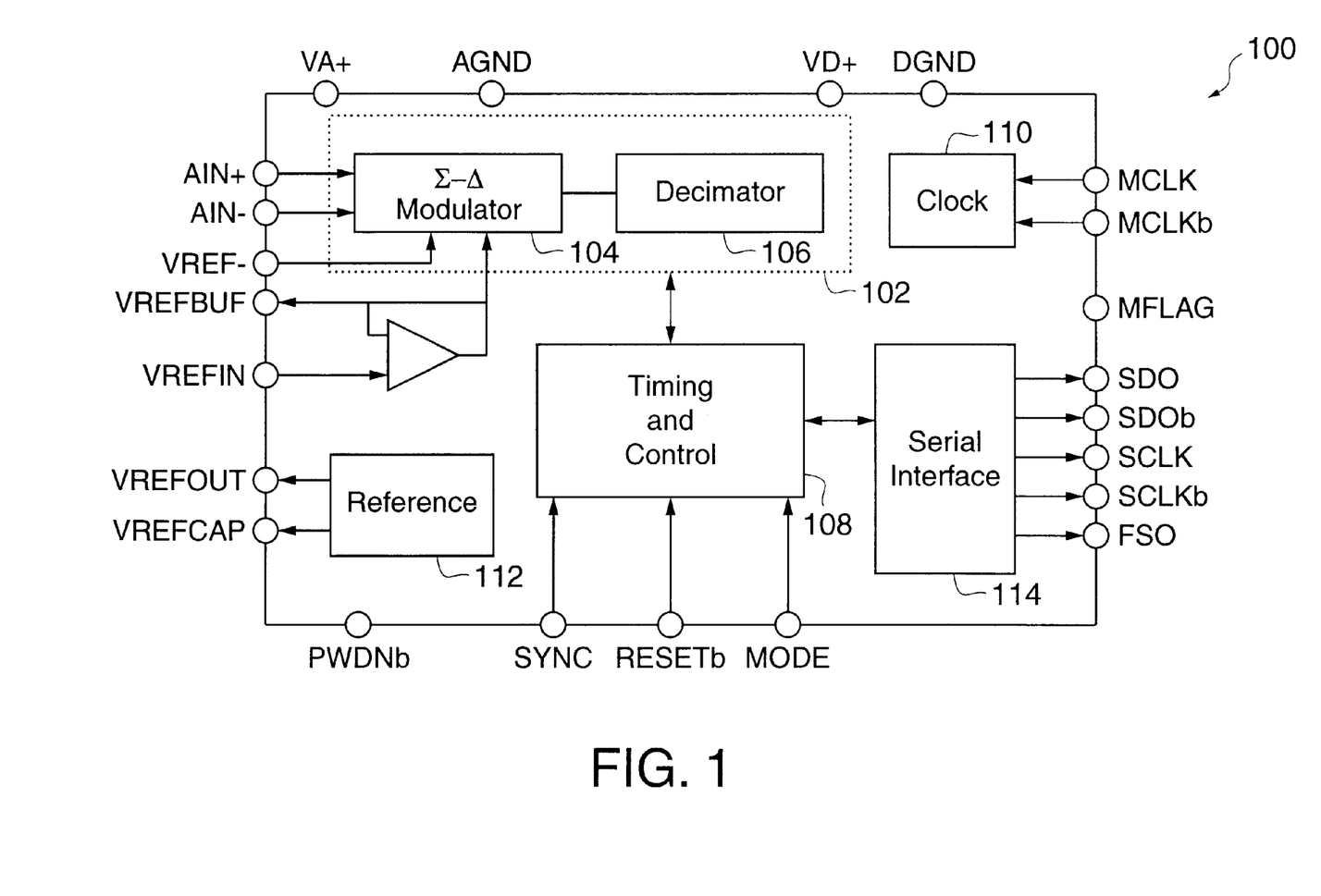
FIG. 1 is a block diagram illustrating an exemplary analog-to-digital converter (ADC) integrated circuit which implements the present invention.

FIG. 1 is a schematic block diagram that illustrates, as an example, analog-to-digital converter (ADC) integrated circuit 100 that utilizes the input sampling structure in accordance to the present invention. However, it should be clear to a person of ordinary skill in the art that the input sampling structure is suitable for other applications including signal processing, communications, and the like.

ADC integrated circuit 100 is a fully-calibrated high-speed delta-sigma ADC that presently reaches a 400 ksample/second output word rate. ADC integrated circuit 100 operates from a single +5V power supply. The processing portion of ADC integrated circuit 100 is a analog-to-digital converter (ADC) block 102 that includes a delta-sigma modulator 104 and a digital filter 106. In ADC integrated circuit 100, the digital filter 106 is a combined digital filter and decimator. ADC integrated circuit 100 also includes interface, control, and timing functionality in a timing and control block 108, a clock circuit 110, a voltage reference block 112, and a serial interface 114.

The ADC block 102 has an input voltage range of 4.0V peak-to-peak fully differential. The ADC block 102 functions as a low-pass digital filter. The illustrative ADC block 102 attains a monotonic resolution of 16 bits, a differential nonlinearity of ±0.5 LSB, and an integral nonlinearity of ±1 LSB. The ADC block 102 also attains a DC common-mode rejection ratio of 50 dB, an offset error of ±4 LSB, and a full-scale error of ±4 LSB. The gain drift with an internal reference is about ±50 ppm/°C. The gain drift with external reference is about ±20 ppm/°C.

The ADC block 102 uses a delta-sigma conversion technique to convert an analog input signal into a corresponding digital word. Analog input signals are continuously sampled thereby advantageously avoiding usage of an external sample-and-hold circuit.

The clock circuit 110 is connected to a master clock pin MCLK and an inverse master clock pin MCLKb for receiving master clock signals. The output word rate of the ADC 100 is scaleable with the master clock rate. In one embodiment, the signal processing integrated circuit 100 is optimized to operate at a master clock rate of 25.6 MHz, although a lower speed clock may alternatively be used.

The voltage reference block 112 is an on-chip voltage reference, although an off-chip reference may alternatively be used for higher precision applications. The on-chip reference is approximately +2.375V relative to an AGND pin and is generated as an output voltage reference at a VREFOUT pin. The reference voltage for the signal processing integrated circuit 100 is connected to a VREFIN input pin. The signal processing integrated circuit 100 may be configured to measure bipolar signals relative to a selected common-mode voltage, for example +2.5V. With a 2.5V reference between the VREFIN pin and the AGND pin, the signal processing integrated circuit 100 accepts a bipolar analog input signal of ±2.0V where input levels are relative to a +2.5V common-mode to attain an input voltage span of 4.0Vp-p. The signal processing integrated circuit 100 uses self-calibration to improve offset and gain accuracy. The illustrative signal processing integrated circuit 100 is designed to attain a 93 dB signal to noise ratio with a full scale bipolar input signal using a 2.5V voltage reference. Central and limiting signal values and digital output signals that are respectively produced are shown in Table I, as follows:

| AIN+ | AIN− | Output Code (Twos Complement) |
|---|---|---|
| +1.0 | −1.0 | 0x7FFF |
| 0.0 | 0.0 | 0x0000 |
| −1.0 | +1.0 | 0x8000 |

The timing and control block 108 has a connection to a SYNC input pin for full synchronization with an external system clock. The SYNC input signal is used to restart the digital filter 106 of the ADC block 102 at the beginning of a convolution cycle. Accordingly, the SYNC input signal is used to synchronize the filters of multiple converters in a system. When the SYNC signal goes high, the filter is initialized. When the SYNC signal returns low, the filter begins a convolution cycle on the next rising edge of the master clock MCLK signal.

The timing and control block 108 also has a connection to a PWDN pin for enabling and disabling a low power mode that reduces power consumption when a system including the signal processing integrated circuit 100 is inactive. The timing and control block 108 has a MODE pin. When MODE=0 the one-bit output signal of the modulator is accessed through the SDO and SDOb pins. When MODE=1 the 16-bit decimator data is accessed through the SDO and SDOb pins.

The serial interface 114 generates a serial data output signal (SDO) to form a high-speed digital signal that corresponds to the signal applied to the input terminals of the ADC block 102. The serial interface 114 also produces a frame sync output signal (FSO) and a serial clock signal (SCLK). The serial data output signals SDO and SDOb are output pins that generate a 16-bit serial data word. The SDOb signal is the complement of the SDO signal and, in combination, reduce radiated noise if the two lines are run adjacent on a PC trace layout. Complementary signals SCLK and SCLKb are supplied to similarly reduce radiated noise.

SDO and SDOb digital data are output in the order from MSB first to LSB last. The complementary serial clock output signals SCLK and SCLKb produce a continuous serial clock output signal from the ADC block 102 at a rate of one-third the master clock MCLK rate. The SDO and SDOb bits are valid on the rising edge of the serial clock output signal SCLK. The frame sync output (FSO) signal indicates the beginning of a serial data output word from the SDO pin. Thus, the FSO signal produces a framing pulse that is low for the duration of the sixteen data bits of serial data output from SDO and therefore has a rate equal to the output word rate (OWR).

The serial clock signals SCLK and SCLKb, the serial data output signals SDO and SDOb, and the frame sync output signal FSO are all synchronous with the master clock MCLK.

Figure 2:
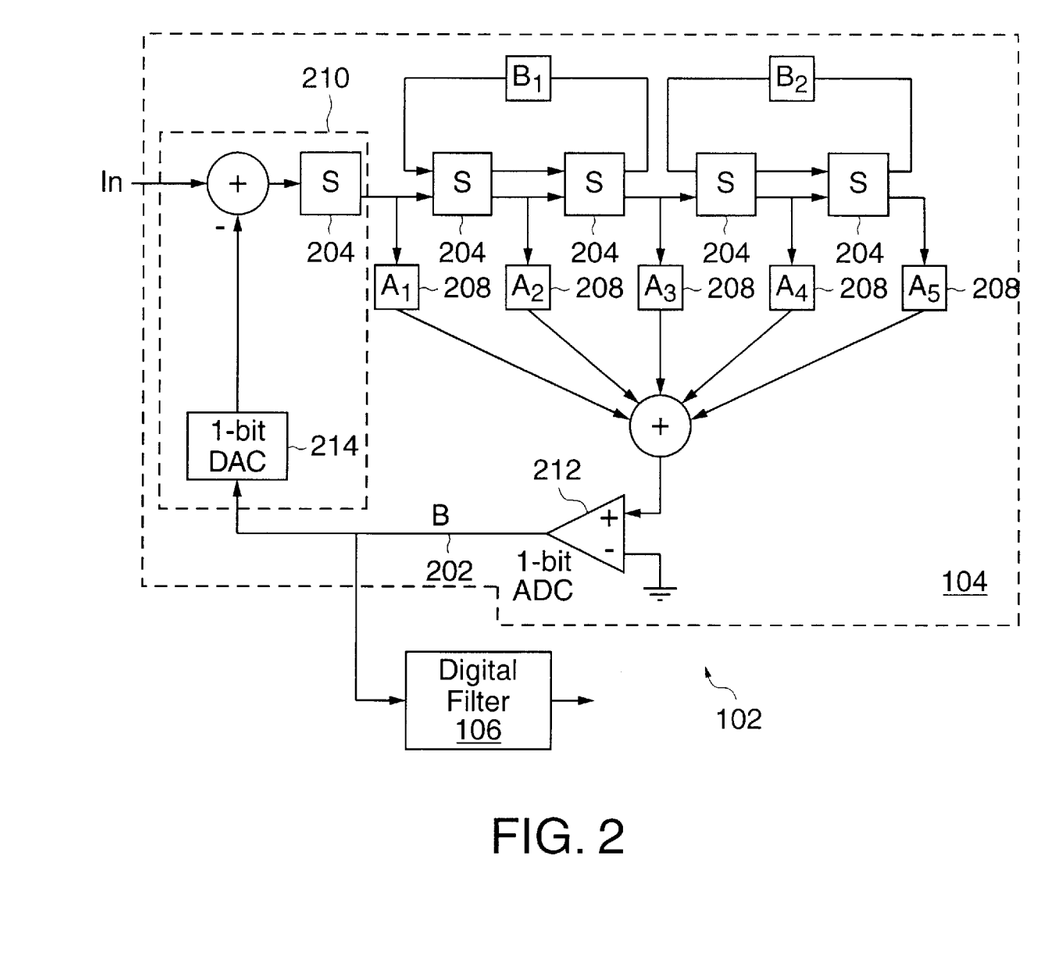
FIG. 2 is a block diagram illustrating the delta-sigma modulator and the digital filter of FIG. 1.

Referring to FIG. 2, a schematic block diagram illustrates an embodiment of the ADC block 102 including an input circuit 210, the delta-sigma modulator 104 and the digital filter 106. The ADC block 102 functions as a single-bit analog-to-digital converter having an analog negative feedback loop 202 with a high open loop gain. Having the modulator loop 202 allows the delta-sigma modulator 104 to oversample and process an analog input signal at a rate much higher than the bandwidth of interest. Delta-sigma modulator 104 provides as output single-bit packets of information at a high rate and in the required format. The output signal of delta-sigma modulator 104 is then processed by the digital filter 106 to extract a higher resolution, for example 16-bits, at a lower rate.

Digital filter 106 further performs digital filtering and decimation on the output signal of delta-sigma modulator 104 to produce a non-aliased result. The ADC block 102 includes an oversampled delta-sigma modulator 104 that computes at a much higher rate than the final output word rate. The digital filter 106 includes a decimator that translates the data flow from a higher sampling rate at which the delta-sigma modulator 104 is operating to the final output word rate. A filter is included prior to decimation to prevent aliasing that otherwise occurs whenever down-sampling occurs. The digital filter 106 is a multiple-stage filter that includes stages with different rates of decimation. For example, the digital filter 106 may include a comb filter 302 shown in FIG. 3 that decimates by 32 and a final FIR stage 304 that decimates by two.

For example in a system that has an output word rate of 400 kHz, the digital filter 106 accepts a one-bit stream from the delta-sigma modulator 104 at a 25.6 MHz rate. The operational concept of a delta-sigma modulator involves the performance of a simple, low-resolution analog-to-digital conversion and reduce resulting "quantization noise", without affecting the frequency band of interest, using analog and digital filtering. The one-bit stream is filtered by the digital filter 106 to generate an output word rate of 400 kHz. During offset and gain calibrations, a sufficient number of conversion words are averaged to ensure repeatability. Output words from the filter are passed to the serial interface 114 for external transfer.

In the ADC block 102, the digital filter 106 that is used in the analog-to-digital conversion process also performs system-level filtering, typically with a performance higher than is attained otherwise by filtering the analog signal. In the illustrative ADC block 102, the system-level filtering is a decimation filtering operation.

The delta-sigma modulator 104 includes a plurality of integrators 204 coupled in a sequence. In the illustrative embodiment, the delta-sigma modulator 104 includes five integrators 204 connected in series. Accordingly, each sequential integrator 204 receives as input an output signal from the previous integrator 204. The illustrative delta-sigma modulator 104 includes a feedback path from the third integrator to the second integrator, which is scaled by a factor $B_1$, and a feedback path from the fifth integrator to the fourth integrator, which is scaled by a factor $B_2$. The output signals of the integrators 204 are scaled using gain blocks 208. The scaled output signals are then summed by a summer 206. In the exemplary embodiment of the delta-sigma modulator 104, five gain blocks 208 scale the integrated signals by factors $A_1, A_2, A_3, A_4$, and $A_5$. The output signal from the summer 206 is applied to a 1-bit ADC 212. The exemplary 1-bit ADC 212 acts as a comparator that generates a "0" value or "1" value depending on whether its input is positive or negative. The output signal B from the comparator (1-bit ADC 212) is the delta-sigma modulator output signal. The delta-sigma modulator output signal B is sent to a digital-to-analog converter (DAC) 214 to be converted back to analog domain. The DAC output signal is subtracted from the ADC input at a summer that is part of input circuit 210 before being sent to the first integrator 204 in the sequence of integrators.

The integrators 204 perform analog filtering that is used in the modulator loop 202 to reduce noise in the frequency band of interest by shaping away the quantization noise spectrum resulting from the operation of the comparator 208. The noise spectrum is shaped without appreciably affecting the spectrum of the input signal. Quantization noise at the output terminal of the delta-sigma modulator 104 is reduced by the open-loop gain of the integrators 204. At low frequency, the integrators 204 have a high open-loop gain to reduce quantization noise. The integrators 204 effectively push the quantization noise out of the bandwidth of interest into higher frequencies. Digital lowpass filtering then removes the quantization noise at the higher frequencies without affecting the low-frequency spectrum of interest.

The digital filter 106 receives the single-bit digital output signal from the delta-sigma modulator 104. A digital filter for a low-order delta-sigma modulator typically performs simple digital averaging or integrating so that the output signal from the digital filter is an average input value during he integrating period. For an advanced or higher-order delta-sigma modulator, a more powerful digital filter is used to supply additional information regarding higher resolution of the input analog data at higher frequencies. For example, the illustrative signal processing integrated circuit 100 includes a fifth-order delta-sigma modulator 104 so that the digital filter 106 is more sophisticated than a counter to interpret the processed information.

In the illustrative signal processing integrated circuit 100, the digital filter 106 includes a digital finite impulse response (FIR) filter that performs a rolling, weighted average of consecutive samples. Application of the weighting function to the one-bit input signal from the delta-sigma modulator 104 enables the digital filter 106 to assemble an N-bit output signal with $2^N$ possible values without incurring a latency of $2^N$ samples.

The input signal and digital filtering spectrum of an ADC repeat around integer multiples of the sampling rate. The digital filter 106 does not reject noise in the region around integer multiples of the sampling rate. If noise is present in those regions, analog filtering is used to remove the aliased noise at the input terminal of the ADC block 102. Otherwise, aliasing occurs and aliased noise passes unfiltered to the output terminal of the ADC block 102. Fortunately, the delta-sigma ADC block 102 greatly oversamples the input signal so that only a gentle rolled off analog anti-alias filter is needed. In the illustrative embodiment, a single-pole, passive RC filter external to the integrated circuit is included to sufficiently remove aliased noise. The input circuit 210 also includes an input sampling structure.

The digital filter 106 includes a decimation filter that reduces the effective sampling rate of the ADC block 102. The decimation filter is useful since the delta-sigma modulator ADC oversamples and processes analog samples at a frequency that is much higher than the bandwidth of interest while the ADC generates a high-resolution digital output signal at a much lower sampling rate. In general, the decimation filter operates by selectively reading some of the available samples thereby reducing the sampling rate.

Figure 3:
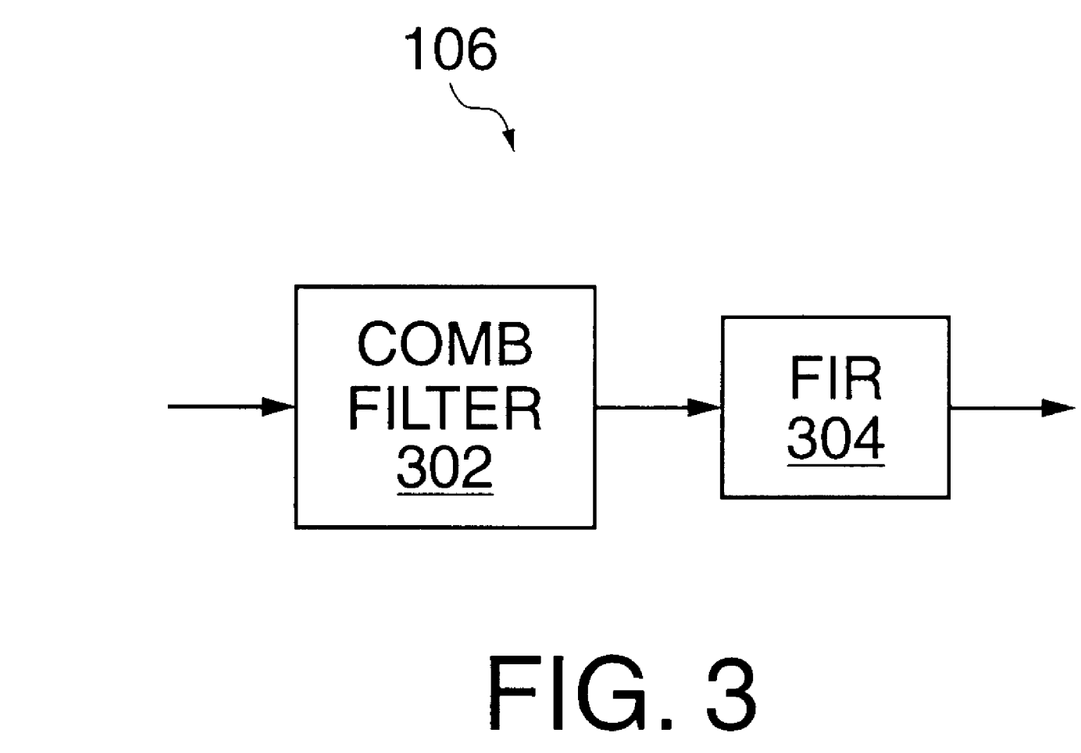
FIG. 3 is a schematic block diagram illustrating an embodiment of the digital filter.

Referring to FIG. 3 illustrating a schematic block diagram of an embodiment of the digital filter 106. The digital filter 106 includes a comb filter 302 followed by a finite impulse response (FIR) filter 304. The comb filter 302 is a high-order sinc function that decimates by 32. The output signal from the comb filter 302 is passed to the FIR filter 304. The FIR filter 304 decimates by two and compensates for the droop of the sinc filter. In the present embodiment, the combined digital filter 106 attains a passband ripple of 0.05 dB from dc to 0.46 Fs, a transition band from 0.46 Fs to 0.5 Fs, and a stopband attenuation of at least 90 dB.

Figure 4:
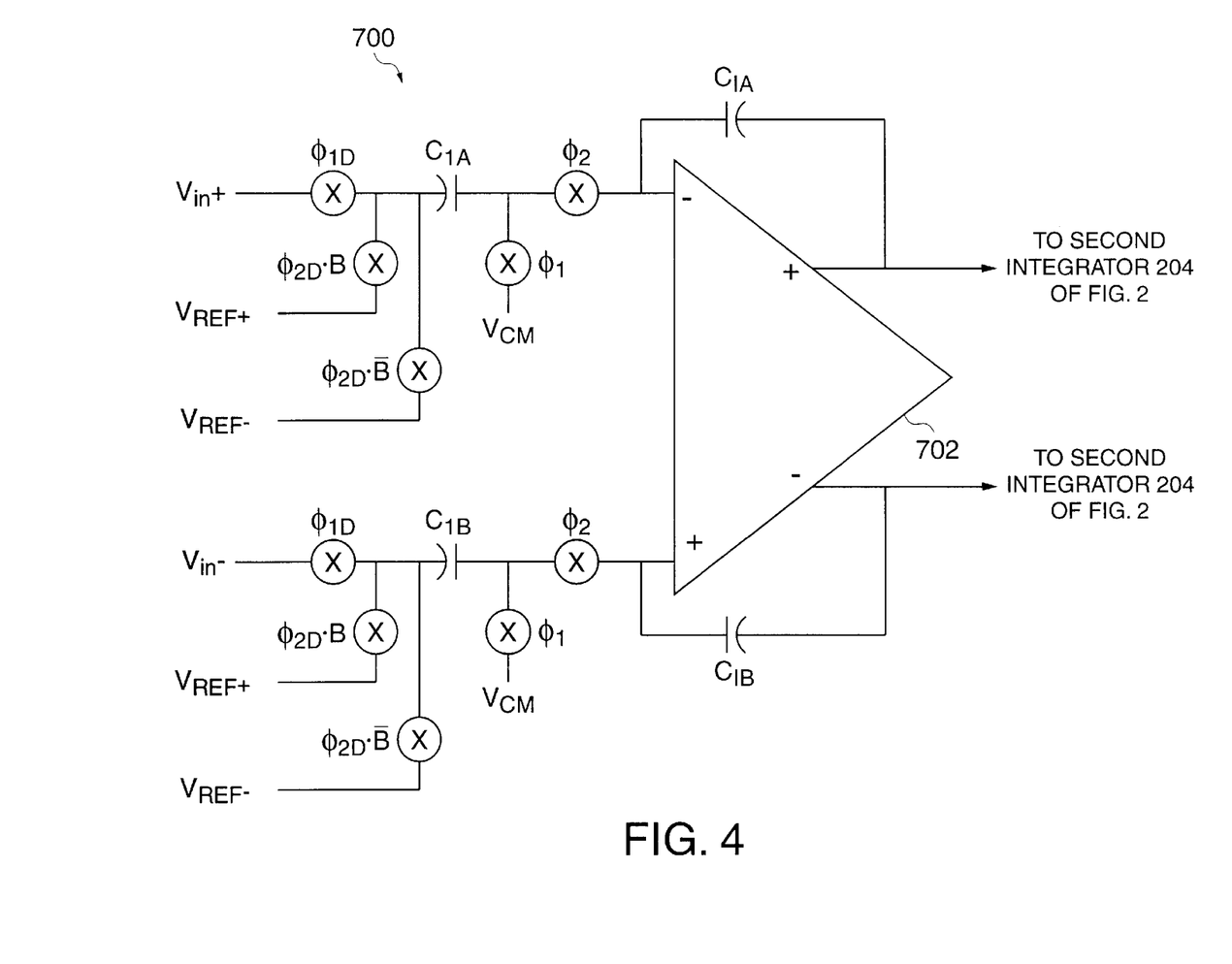
FIG. 4 is schematic circuit diagram illustrating an embodiment of an input sampling structure having fully differential input.

FIG. 4 is a schematic circuit diagram showing an embodiment of a sampling structure 700 having fully differential input that is part of the input circuit 210. The input sampling structure 700 performs several functions including: (a) sampling the input signal; (b) digital to analog conversion (DAC) on the 1-bit output of the modulator; and (c) subtracting the DAC output signal from the input signal.

The input sampling structure 700 includes an operational amplifier 702 with integration capacitor $C_{IA}$ connected between its positive output terminal and its negative input terminal and an integration capacitor $C_{IB}$ connected between its negative output terminal to its positive input terminal. Operational amplifier 702 combined with integration capacitors $C_{IA}$ and $C_{IB}$ to make up the first integrator 204 in the series that is shown in FIG. 2. The negative input terminal of the integrator operational amplifier 702 is also connected to input voltage connection $V_{IN+}$, reference voltage $V_{REF+}$, and reference voltage $V_{REF-}$ through input sampling capacitor $C_{1A}$. The positive input terminal of the integrator operational amplifier 702 is also connected to input voltage connection $V_{IN-}$, reference voltage $V_{REF+}$, and reference voltage $V_{REF-}$ through input sampling capacitor and $C_{1B}$. Phase 1 delayed ($\Phi_{1D}$) sampling switches are connected between the input voltage $V_{IN+}$ and input capacitor $C_{1A}$ as well as between the input voltage $V_{IN-}$ and input capacitor $C_{IB}$. Phase 2 delayed ($\Phi_{2D}$) ANDed with the one-bit data B controls the switch between $V_{REF+}$ and input capacitor $C_{1A}$ as well as the switch between $V_{REF-}$ and input capacitor $C_{1B}$. The one-bit data B is the output of DAC 214. Phase 2 delayed ($\Phi_{2D}$) ANDed with the complement of the one-bit data B controls the switch between $V_{REF-}$ and input capacitor $C_{1A}$ as well as the switch between $V_{REF+}$ and input capacitor $C_{1B}$. Phase 2 ($\Phi_{2}$) sampling switches are connected between the input capacitors $C_{1A}$ and $C_{1B}$ and the negative and positive input terminals of the integrator operational amplifier 702, respectively. Phase 1 ($\Phi_{1}$) sampling switches are connected between the common-mode voltage $V_{CM}$ and the input capacitors $C_{1A}$ and $C_{1B}$. In so doing, the switches control the sampling of the input voltages $V_{IN\pm}$ and reference voltages $V_{REF\pm}$ via the input capacitors $C_{1A}$ and $C_{1B}$.

The input sampling structure 700 draws a signal-dependent current from the voltage reference source which makes the reference voltage source signal-dependent since the reference source has a finite output impedance. The reference voltage operates to multiply the bit stream generated by the ADC block 102 and creates harmonic components that are added to the sampled signal. However, the input sampling structure 700 does not draw any signal-dependent input current from the analog input sources $V_{IN\pm}$ thereby advantageously reducing gain error. Signal-dependent input current causes gain error by generating a signal-dependent voltage drop across an anti-aliasing resistor (not shown). The input sampling structure draws common-mode current from both the input voltage connections $V_{IN\pm}$ and the reference voltage sources $V_{REF\pm}$.

Figure 5:
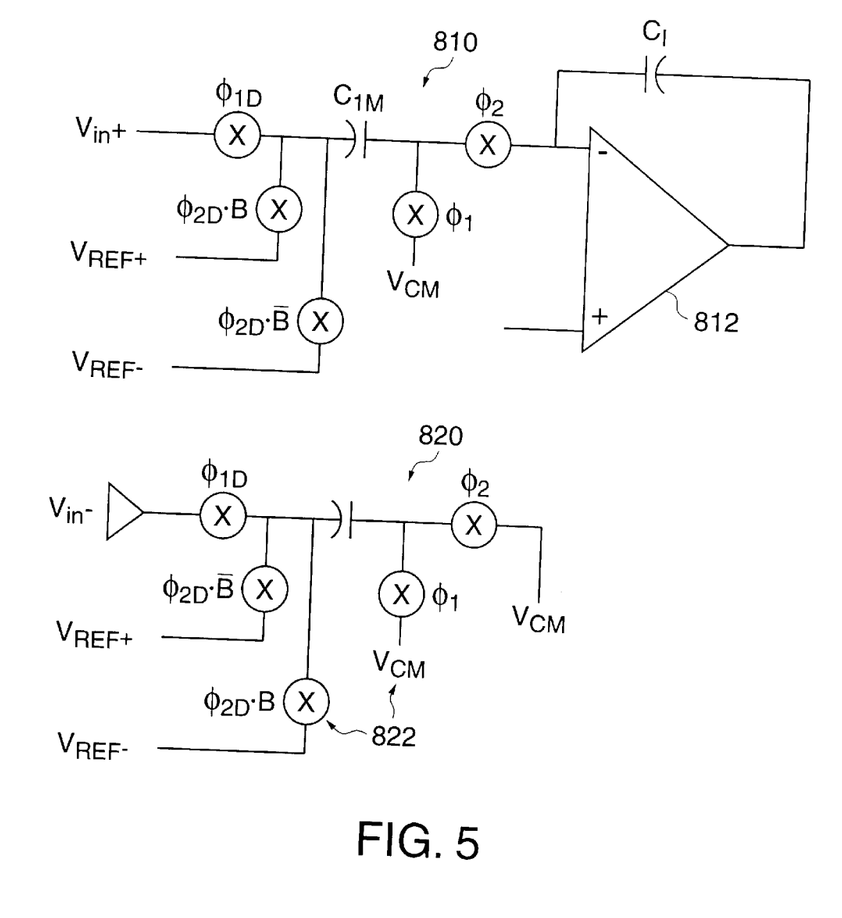
FIG. 5 is a schematic circuit diagram depicting an embodiment of a single-ended input sampling structure that substantially eliminates the signal-dependent reference current through usage of a replica cancellation technique in accordance to the present invention.

Referring now to FIG. 5, illustrating an embodiment of a single-ended input sampling structure 800 that substantially eliminates the signal-dependent reference current through usage of a replica cancellation technique in accordance to the present invention. The input sampling structure 800 includes both a main sampler 810 and a replica sampler 820. The main sampler 810 includes an integrator operational amplifier 812. The replica sampler 820 does not include an integrator operational amplifier but does have an input structure 822 that includes the switches and input capacitor. The input signal is buffered in the replica sampler 820 to reduce or eliminate signal dependent current from the input voltage signal $V_{IN}$. The replica sampler and the main sampler combine to reduce or eliminate signal dependent current from the reference voltage sources $V_{REF\pm}$.

The main input sampler 810 includes an integrator operational amplifier 802 and a switched capacitor $C_{1M}$. The capacitor $C_{1M}$ has switched connections to input voltage signal $V_{IN}$ and reference voltage signals $V_{REF\pm}$. The replica sampler 820 is used to eliminate or reduce signal-dependent current that is drawn from the reference signal lines $V_{REF\pm}$ by canceling the current flow in the main input sampler 810. The replica sampler has a structure that is similar to the main input structure and includes a switched capacitor $C_{1R}$ which is equal to $C_{1M}$. The capacitor $C_{1R}$ has switched connections to input voltage signal $V_{IN+}$ and reference voltage signals $V_{REF\pm}$. However, the replica sampler, in contrast to the main input structure, uses a buffered input signal line and has a polarity of the switching of the reference signal lines $V_{REF\pm}$ that is opposite to the polarity of switching of the reference signal lines $V_{REF\pm}$ in the main input sampling structure.

Phase 2 delayed ($\Phi_{2D}$) ANDed with the complement of the one-bit data B controls the switch between $V_{REF+}$ and input capacitor $C_{1R}$ in the replica sampler. The one-bit data B is the output of DAC 214. Similarly, phase 2 delayed ($\Phi_{2D}$) ANDed with the one-bit data B controls the switch between $V_{REF-}$ and input capacitor $C_{1R}$. As demonstrated in FIG. 5, opposite polarities of the one-bit data B are used in the replica sampler 820 in comparison to the polarities applied in the input sampler 810. One advantage of the input sampling structure 800 is that a small total input capacitance is used for a given kT/C noise performance. Such a small input capacitance is advantageous for improved operational amplifier settling and reduced operational amplifier power. Other structures with the same total input capacitance and the same kT/C noise performance have the disadvantage that both the input and reference voltages are double sampled. A result of double sampling is that the output of the first integrator 204 in the series (shown in FIG. 2) does not settle during phase 2, possibly corrupting the quantizer decision with input noise. The reference signals becoming signal-dependent is also possible in the dual double-sampling scheme.

Another advantage of the input sampling structure 800 in FIG. 5 is that little or no signal-dependent current is drawn from the input terminal. Signal-dependent input current causes gain error by generating a signal-dependent voltage drop across an anti-aliasing resistor (not shown). Input sampling structure 800 uses buffering in the replica sampler so that little or no signal-dependent current is drawn from the input signal lines. If the input signal lines are not buffered in the replica sampler, then the current drawn from the input signal lines is signal-dependent. Buffering allows the current drawn from the input signal lines to remain signal independent. If signal-dependent current from the input signal lines is not a problem, then an alternative embodiment of the replica sampling structure without buffers may be implemented.

The input sampling structure 800 also has less parasitic capacitance on the summing node at the input of the integrator operational amplifier 812 because of the number of switches used. It is therefore a faster structure in terms of operational amplifier settling time than conventional input sampling structures.

Figure 6:
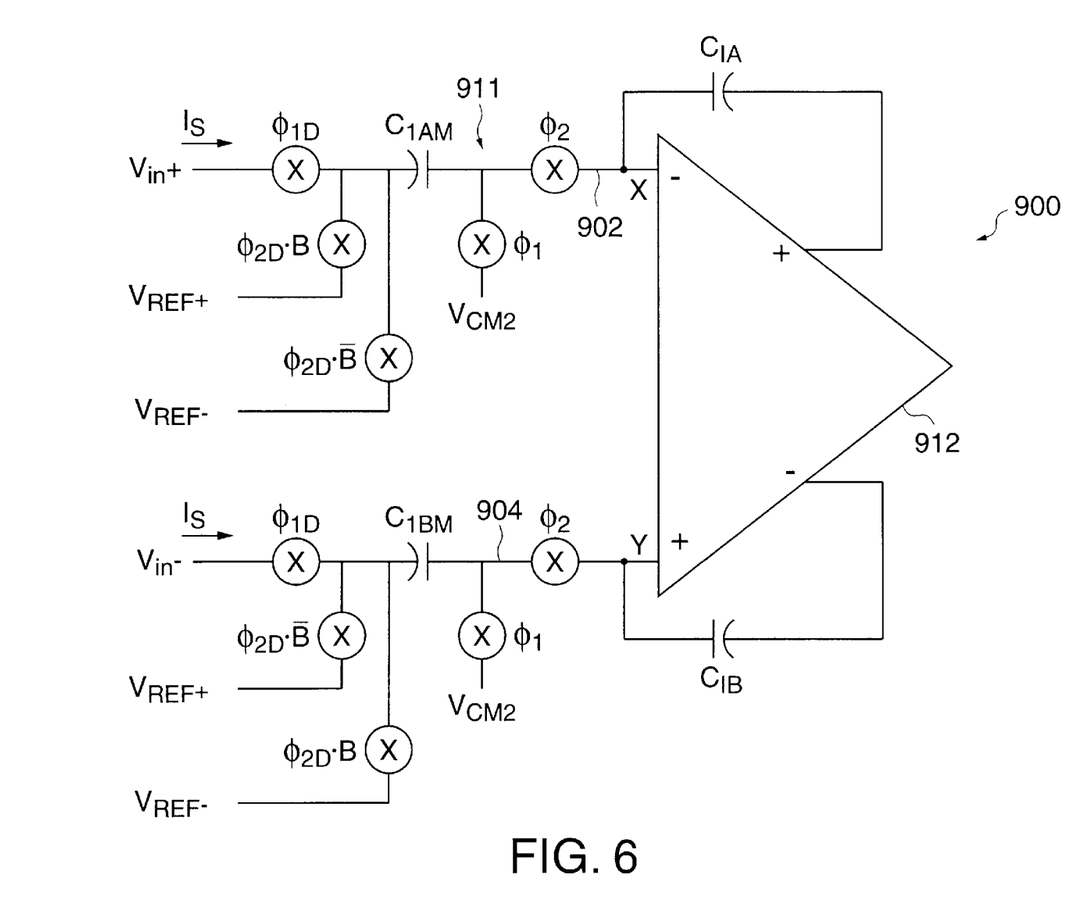
FIG. 6 is a schematic circuit diagram illustrating an embodiment of main input sampling structure having fully differential input that is suitable for acquiring high-speed signals in accordance to the present invention.
Figure 7:
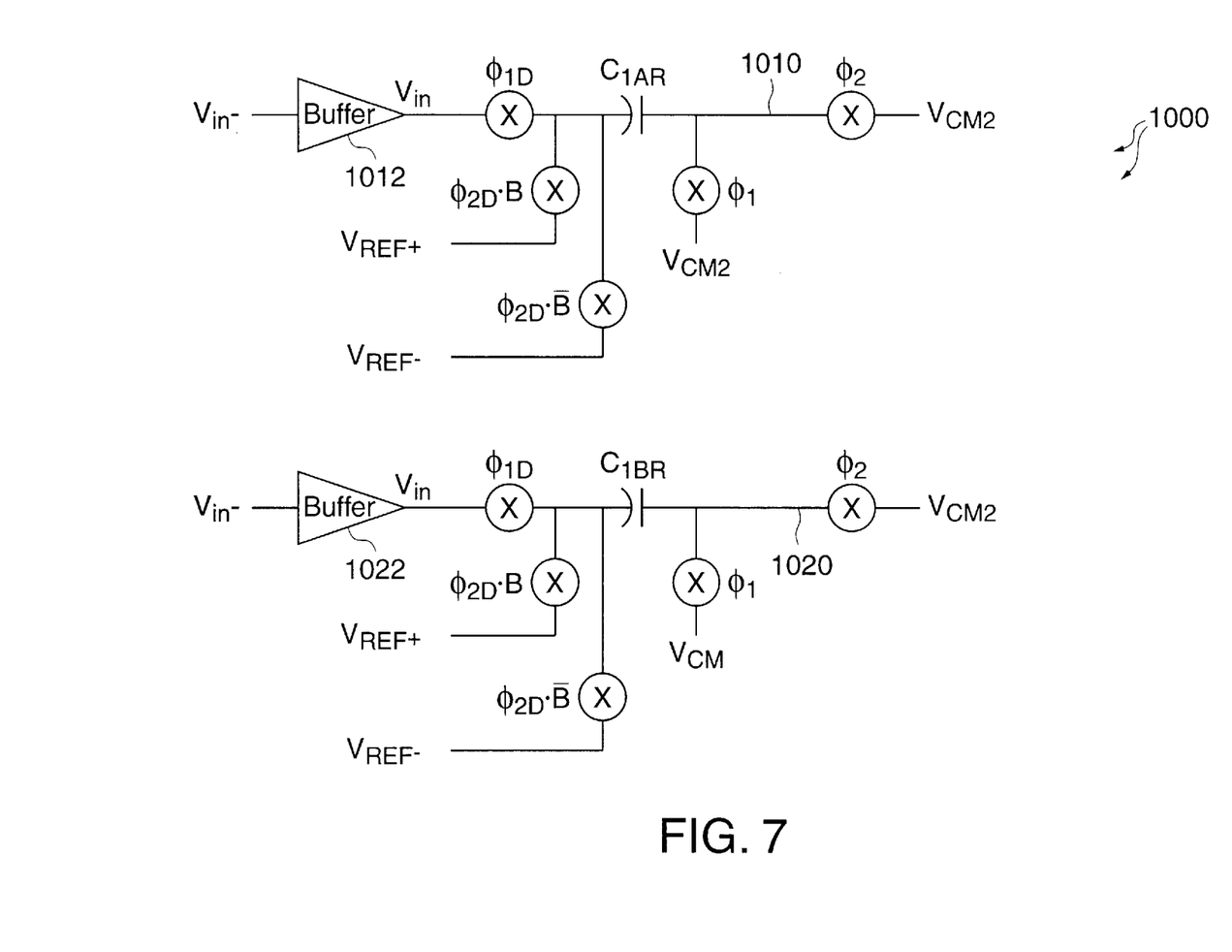
FIG. 7 is a schematic circuit diagram showing an embodiment of a replica sampling structure for the main input sampling structure of FIG. 6.

FIGS. 6 and 7 show an embodiment of a fully differential input sampling structure in accordance to the present invention. FIG. 6 shows a main input sampling structure 900 that is suitable for acquiring high-speed signals. The main input sampling structure 900 has a distinguishing advantage of avoiding gain error by reducing or eliminating the signal-dependent current drawn from the input signal which is discussed later. However, the main input sampling structure 900 still draws a signal-dependent current from reference voltage sources $V_{REF+}$ and $V_{REF-}$ in the main input sampling structure 900 and is therefore susceptible to harmonic distortion.

To eliminate or reduce the signal-dependent current from reference sources $V_{REF+}$ and $V_{REF-}$ and the input signals Vin+ and Vin−, the main input sampling structure 900 is combined with a replica sampling structure 1000 (shown in FIG. 7) to attain signal-independent current from the input signals Vin+ and Vin− and the reference voltage sources $V_{REF+}$ and $V_{REF-}$ to eliminate both harmonic distortion and gain error. Replica sampling structure 1000, shown in FIG. 7, in combination with the main input sampling structure 900 form an efficient and highly linear input sampling structure in the input circuit 210 at the front end of the delta-sigma modulator 104.

The main input sampling structure 900 receives input signals $V_{IN+}$ and $V_{IN-}$. It also receives the output from DAC 214. The signal processing integrated circuit 100 includes a main input sampling structure 900 with a switched capacitor integrator. The main input sampling structure 900 includes a fully-differential operational amplifier 912, two integration capacitors $C_{IA}$ and $C_{IB}$ respectively that are connected between the differential output terminals and the input terminals of the integrator operational amplifier 912, switched capacitors $C_{1AM}$ and $C_{1BM}$, and a plurality of switches driven by timing signals $\Phi_1$, $\Phi_2$, $\Phi_{1D}$, $\Phi_{2D}$. Operational amplifier 912 combined with integration capacitors $C_{IA}$ and $C_{IB}$ make up the switched capacitor integrator which is the first integrator 204 in the series that is shown in FIG. 2. The capacitors $C_{1AM}$ and $C_{1BM}$ have switched connections to input signal lines $V_{IN\pm}$ respectively and reference signal lines $V_{REF\pm}$. A replica sampling structure 1000 is connected to the signal processing circuit 100 to eliminate or reduce signal-dependent current that is drawn from the reference signal lines $V_{REF\pm}$. The replica sampling structure 1000 includes the switched input capacitors and reference signal lines $V_{REF\pm}$ of the main input sampling structure 900 but uses buffered input signal lines and has a polarity of the switching of the reference signal lines that is opposite to the polarity of the main input sampling structure 900 reference signal lines. Buffering of the input signal lines eliminates or reduces the signal-dependent current drawn from the input signal lines $V_{IN\pm}$.

For the main input sampling structure 900, phase 2 delayed ($\Phi_{2D}$) ANDed with one-bit signal B controls the switch between voltage reference $V_{REF+}$ and switched capacitor $C_{1AM}$, and the switch between voltage reference $V_{REF-}$ and switched capacitor $C_{1BM}$. The one-bit data B is the output of DAC 214. Phase 2 delayed ($\Phi_{2D}$) ANDed with the complement of bit B controls the switch between the voltage reference $V_{REF-}$ and switched capacitor $C_{1AM}$, and between the voltage reference $V_{REF+}$ and switched capacitor $C_{1BM}$. Two sampling switches for the phase $\Phi_1$ timing signal connect switched capacitors $C_{1AM}$ and $C_{1BM}$ to the negative and positive terminals respectively, of the operational amplifier 912. Two sampling switches for the phase $\Phi_1$ timing signal connect switched capacitors $C_{1AM}$ and $C_{1BM}$ to a common-mode voltage reference $V_{CM2}$.

Signals $\Phi_{1D}$ and $\Phi_{2D}$ are slightly delayed in time with respect to $\Phi_1$ and $\Phi_2$ to ensure that the charge injection of the main input sampling structure 900 is predictable from clock cycle to clock cycle and not signal-dependent. Signal dependency of the charge injection disadvantageously results in distortion that is avoided using the main input sampling structure 900.

In the current embodiments, reference voltages $V_{REF\pm}$ and capacitances of the integration capacitors $C_{IA}$–$C_{IB}$ and the input capacitors $C_{1AM}$–$C_{1BM}$ are selected so that, in a steady state, no resultant charge enters the integration capacitors $C_{IA}$–$C_{IB}$. Therefore, the input signal charge and reference charge cancel each other out. In one example, the reference voltage $V_{REF-}$ is set equal to 0V for simplicity. Since $V_{REF}$ is equal to $V_{REF+}$–$V_{REF-}$, $V_{REF}$ is therefore equal to $V_{REF+}$. In which case, it should be clear to a person of ordinary skill in the art that the main input sampling structure 900 generates an input signal current $i_{S(Main)}$ which is given by equation (1) as follows:

$$f_{CLK}*(V_{CM1}-V_{CM2}+V_{CM3}-V_{REF}/2)*C_1=i_{S(Main)}, \quad (1)$$

wherein $f_{CLK}$ is the sampling frequency, $V_{CM1}$, $V_{CM2}$ and $V_{CM3}$ are common-mode voltages, $V_{REF}$ is the reference voltage, and $C_1$ is the input capacitance. $V_{CM1}$ is defined as $$V_{CM1} = \frac{V_{IN+} + V_{IN-}}{2}, \quad (2)$$

$$C_{1AM} = C_{1BM} = C_1, \quad (3)$$

And $V_{CM3}$ is defined as:

$$V_{CM3} = \frac{V(X) + V(Y)}{2}. \quad (4)$$

wherein V(X) and V(Y) are the voltages at nodes X and Y shown in FIG. 6.

The signal current $i_{S(Main)}$ in equation (1) is signal-independent because all terms are constant to first-order.

The illustrative main input sampling structure 900 advantageously does not draw a signal-dependent current from the input signal. Instead, the input current is substantially a constant common-mode current. The signals applied to the signal processing integrated circuit 100 are typically passed through an anti-aliasing filter. The anti-aliasing filter is generally a simple R-C filter with the resistor and capacitor components being external to the signal processing integrated circuit 100. Avoidance of a signal-dependent current is advantageous since the current is passed through the resistor in the anti-aliasing filter and causes a signal-dependent voltage drop that results in a gain error. These gain errors are most serious in a system with high clock rates since high rates increase the signal-dependent current levels.

The illustrative main input sampling structure 900 advantageously reduces or avoids the signal-dependent current and thereby reduces or avoids gain errors. The main input sampling structure 900 also advantageously includes a reduced number of switches in the summing node of the operational amplifier in comparison to other sampling structures. As a result, it is a faster structure in terms of operational amplifier settling time than conventional input sampling structure.

However, the main input sampling structure 900 introduces some distortion as a result of the voltage references $V_{REF+}$ and $V_{REF-}$ charging the input capacitors $C_{1A}$ and $C_{1B}$ to the voltages of the voltage references such that a signal-dependent current is drawn from the reference sources $V_{REF+}$ and $V_{REF-}$. This is because the input capacitors $V_{1A}$ and $C_{1B}$ are first charged in phase 1 to the input signal voltage $V_{IN+}$ and $V_{IN-}$ before they are charged to the reference voltages $V_{REF+}$ and $V_{REF-}$ in phase 2. Such a signal-dependent current from the voltage references $V_{REF+}$ and $V_{REF-}$ causes the reference signals to be signal-dependent. The reference signals are effectively multiplied by the bit value B that is fed back from the 1-bit ADC 212 and the bit value B reflects the signal level so a signal-dependent distortion is introduced.

Referring to FIG. 7, a schematic circuit diagram illustrates an embodiment of a replica sampling structure 1000. The replica circuit includes a switched capacitor and a plurality of switches controlled by timing signals $\Phi_1$, $\Phi_2$, $\Phi_{1D}$, and $\Phi_{2D}$. The signal processing integrated circuit 100 avoids or reduces the distortion resulting from the signal-dependent current drawn from the reference sources $V_{REF+}$ and $V_{REF-}$ by including a replica sampling structure 1000 in the ADC block 102. The replica sampling structure 1000 reduces or eliminates signal-dependent current from the reference sources $V_{REF+}$ and $V_{REF-}$. A first side of the switched capacitor $C_{1AR}$ of the replica input line 1010 has a first input connection to a buffer 1012 that is controlled by a phase 1 delayed ($\Phi_{1D}$) sampling switch. The input signal to the buffer 1012 is connected to the positive input signal $V_{IN+}$. The first side of the switched capacitor $C_{1AR}$ has a second input connection to a positive reference voltage $V_{REF+}$ through a switch that is controlled by phase 2 delayed ($\Phi_{2D}$) ANDed with complementary bit signal $\overline{B}$. The first side of the switched capacitor $C_{1AR}$ has a third input connection to a negative reference voltage $V_{REF-}$ through a switch that is controlled by phase 2 delayed ($\Phi_{2D}$) ANDed with bit signal B. The second side of the $C_{1AR}$ is connected to $V_{CM2}$ through two switches by phase 1 ($\Phi_1$) and phase 2 ($\Phi_2$) respectively.

The first side of the switched capacitor $C_{1BR}$ of the replica input line 1020 has a first input connection to a buffer 1022 further connected to a negative input voltage source $V_{IN-}$. The input terminal of the buffer 1022 is connected to the negative input signal $V_{IN-}$. The first side of the switched capacitor $C_{1BR}$ has a second input connection to a positive reference voltage $V_{REF+}$ through a switch that is controlled by phase 2 delayed ($\Phi_{2D}$) ANDed with bit signal B. The first side of the switched capacitor $C_{1BR}$ has a third input connection to a negative reference voltage $V_{REF-}$ through a switch that is controlled by phase 2 delayed ($\Phi_{2D}$) ANDed with complementary bit signal $\overline{B}$. The second side of $C_{1BR}$ is connected to $V_{CM2}$ through two switches controlled by phase 1 ($\Phi_1$) and phase 2 ($\Phi_2$) respectively.

The phase switching of the reference voltages in the replica sampling structure 1000 is opposite to the switching phase in the main sampling structure 900. The opposite phase switching causes signal-dependent currents of equal or nearly equal magnitude but with opposite polarity to be drawn from the references $V_{REF+}$ and $V_{REF-}$ by the two respective circuits, resulting in signal-dependent currents drawn from the references that have a magnitude of zero or nearly zero.

As an example, assume that the positive input voltage source $V_{in+}$ is equal to the common mode voltage plus a delta voltage ($V_{CM1}+\Delta$) and the negative input voltage source $V_{in-}$ is equal to the common mode voltage minus the delta voltage ($V_{CM1}-\Delta$). The differential input voltage is therefore equal to $2\Delta$. The system voltage reference $V_{REF}$ is given by $V_{REF}=V_{REF+}-V_{REF-}$. It should be clear to a person of ordinary skill in the art that the replica sampling structure 1000 generates a signal current $i_{S(Replica)}$ given by Equation (5) as follows:

$$f_{CLK}*(V_{CM1}+2\Delta-V_{REF}/2)*C_1=i_{S(Replica)}, \quad (5)$$

where $V_{CM1}$ is a common-mode input voltage, $V_{REF}$ is the reference voltage, $C_1$ is the input capacitance, and $i_{S(Replica)}$ is the replica component of the signal current. The replica current $i_{S(Replica)}$, though signal-dependent, is drawn from the buffers 1012 and 1022. The overall current drawn from the input signal line $i_{S(Main)}$ is signal-independent, as shown in Equation (1). If signal-dependent current from the input terminals is not a problem, the buffers may be eliminated. The reference current is signal-independent with or without buffers.

It should be clear to a person of ordinary skill in the art that the main component of the reference current $i_{REF(main)}$ for an input structure having an architecture including the replica sampling structure 1020 is given by Equation (6) as follows:

$$f_{CLK}*(V_{REF}-V_{CM3}-V_{CM1}+V_{CM2}+\Delta(1-2D))*C_1=i_{REF(Main)} \quad (6)$$

It should also be clear to a person of ordinary skill in the art that the replica component of the reference current $i_{REF(Replica)}$ is given by Equation (7), as follows:

$$(V_{REF}-V_{CM2}-V_{CM1}+V_{CM2}-\Delta(1-2D))*C_1=i_{REF(Replica)} \quad (7)$$

The overall reference current $i_{REF(Overall)}$ is given by Equation (8), as follows:

$$(2V_{REF}-V_{CM3}-2V_{CM1}+V_{CM2})*C_1=i_{REF(Overall)}. \quad (8)$$

The over reference current $i_{REF(Overall)}$ in equation (8) is signal-independent because all terms are constant to first-order.

Hence, the advantage of employing the input sampling structure 900 in combination with the replica sampling structure 1000 is that signal-dependent current from both the input voltage sources $V_{IN\pm}$ and the voltage reference sources $V_{REF\pm}$ is avoided or reduced. This reduces gain error and harmonic distortion. Input sampling structure 900 has a reduced number of switches at the summing node of the integrating operational amplifier in comparison to other structures. A larger number of switches at the summing node results in a greater input capacitance so that faster operational amplifiers are needed to attain the same performance, and also makes the summing node more susceptible to noise coupling.

In comparison to conventional sampling circuits, usage of the replica sampling structure 1000 in combination with the input sampling structure 900 advantageously has an improved efficiency in terms of operational amplifier power, attaining a substantially reduced total capacitance while maintaining the same kT/C noise performance. The structure including the replica sampling structure 1000 and input sampling structure 900 also advantageously has a reduced number of switches on the summing node of the operational amplifier in comparison to conventional sampling circuits. A reduced number of switches advantageously reduces substrate-coupled noise and improves efficiency by reducing operational amplifier power.

Figure 8:
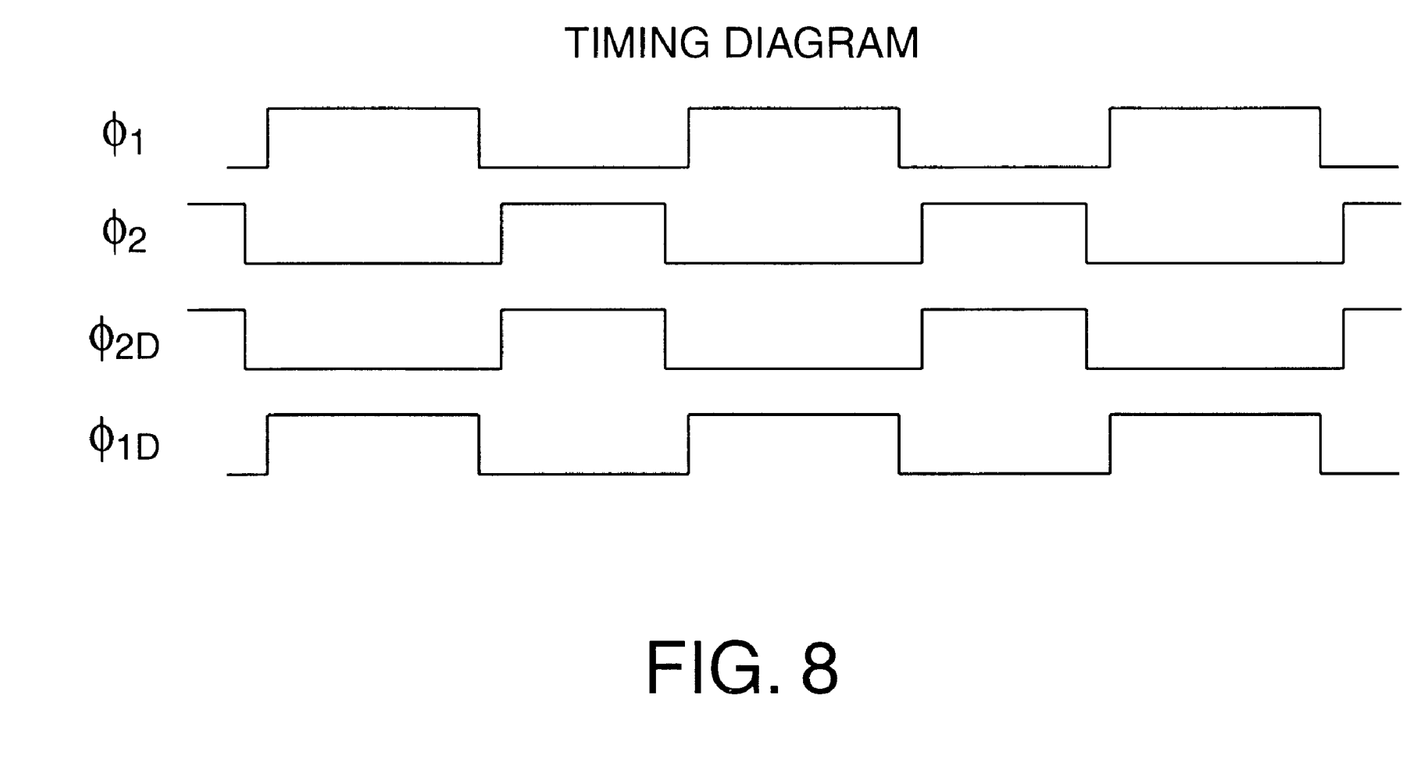
FIG. 8 is a timing diagram which illustrates timing control of the switches shown in FIGS. 4, 5, 6, and 7.

Referring to FIG. 8, a schematic timing diagram illustrates timing control of the switches shown in FIGS. 4, 5, 6, and 7. In the illustrative example, the phase 1 delayed ($\Phi_{1D}$) timing signal is a delayed version of the phase 1 ($\Phi_1$) timing signal. The phase 2 delayed ($\Phi_{2D}$) timing signal is a delayed version of the phase 2 ($\Phi_{2D}$) timing signal. The timing signals are shown in the example with a 50% duty cycle. In other examples, the timing signals may have other duty cycles. The timing signals are controlled using well-known techniques to set the relative delay timing of the phases and durations.

In an actual circuit implementation slight mismatches may occur between components like capacitors and switches thereby causing the input and reference currents to be slightly signal-dependent.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims. For example, the illustrative signal processing system may be formed in an integrated circuit, several integrated circuits, or formed in a plurality of hardware logic or circuit components. Similarly, the signal processing system may be controlled by a process executed on a digital signal processor controlled by software. In other embodiments, the signal processing system may be implemented using a general-purpose computer, a microprocessor, or other computational device.

In the language of the claims, the word "a" is used to express "one or more than one" in describing the number of claimed elements.

We claim:

1. An input sampling circuit comprising:
   main input sampling structure comprising:
      an integrator having a positive input terminal and a negative input terminal;
      a first capacitor; and
      a first plurality of switches for selectively connecting the first capacitor to a common mode voltage, the negative input terminal, a first input signal line, a first reference line, and a second reference line; and
   a first replica input sampling structure coupled to the main input sampling structure, the first replica input sampling structure comprising:
      a first buffer connected to the first input signal line, the first buffer reducing the signal dependent current from the first input signal thereby reducing gain error;
      a second capacitor; and
      a second plurality of switches for selectively connecting the second capacitor to the common mode voltage, the first buffer, and the first and second reference lines such that a signal-dependent current that is drawn from the reference signal lines is cancelled in the main input sampler.

2. The input sampling structure of claim 1, wherein the main input sampling structure further comprises:
   a third capacitor; and
   a third plurality of switches selectively connecting the third capacitor to a common mode voltage, the positive input terminal, a second input signal line, the first reference line, and the second reference line.

3. The input sampling structure of claim 2 further comprises:
   a second replica input sampling structure coupled to the main input sampling structure, the second replica input sampling structure comprising:
      a second buffer connected to the second input signal line, the second buffer reducing the signal dependent current from the second input signal thereby reducing gain error;
   a fourth capacitor;
   a fourth plurality of switches selectively connecting the second capacitor to the common mode voltage, the second buffer, and the first and second reference lines such that a signal-dependent current that is drawn from the reference signal lines is cancelled in the main input sampler.

4. The input sampling structure of claim 3, wherein the first plurality of switches comprises:
   a first switch connected between the common mode voltage and the first capacitor, the first switch is controlled using a $\Phi_1$ control signal;
   a second switch connected between the negative input terminal of the integrator and the first capacitor, the second switch is controlled using a $\Phi_2$ control signal that is approximately 180 degree out of phase relative to the $\Phi_1$ control signal;
   a third switch connected between the first input signal line and the first capacitor, the third switch is controlled using a $\Phi_{1D}$ control signal, wherein the $\Phi_{1D}$ control signal is slightly delayed in phase relative to the $\Phi_1$ control signal;
   a fourth switch connected between the first reference line and the first capacitor, the fourth switch is controlled using a $\Phi_{2D}$.B control signal generated by ANDing the $\Phi_{2D}$ signal with a B signal, wherein the $\Phi_{2D}$ control signal is slightly delayed in phase relative to the $\Phi_2$ control signal; and
   a fifth switch connected between the second reference line and the first capacitor, the fifth switch is controlled using a $\Phi_{2D}$.$\overline{B}$ control signal generated by ANDing the $\Phi_{2D}$ signal with a $\overline{B}$ signal, wherein the $\Phi_{2D}$ control signal is slightly delayed in phase relative to the $\Phi_2$ control signal and the $\overline{B}$ signal is the inverse of the B signal.

5. The input sampling structure of claim 4, wherein the second plurality of switches comprises:
   a sixth switch connected between the common mode voltage and the second capacitor, the sixth switch is controlled using the $\Phi_1$ control signal;
   a seventh switch connected between the common mode voltage and the second capacitor, the seventh switch is controlled using the $\Phi_2$ control signal that is approximately 180 degree out of phase relative to the $\Phi_1$ control signal;
   an eighth switch connected between the first buffer and the second capacitor, the eighth switch is controlled using the $\Phi_{1D}$ control signal, wherein the $\Phi_{1D}$ control signal is slightly delayed in phase relative to the $\Phi_1$ control signal;
   a ninth switch connected between the first reference line and the second capacitor, the ninth switch is controlled using the $\Phi_{2D}$.$\overline{B}$ control signal generated by ANDing the $\Phi_{2D}$ signal with the $\overline{B}$ signal, wherein the $\Phi_{2D}$ control signal is slightly delayed in phase relative to the $\Phi_2$ control signal and the $\overline{B}$ signal is the inverse of the B signal; and
   a tenth switch connected between the second reference line and the second capacitor, the tenth switch is controlled using the $\Phi_{2D}$.B control signal generated by ANDing the $\Phi_{2D}$ signal with the B signal, wherein the $\Phi_{2D}$ control signal is slightly delayed in phase relative to the $\Phi_2$ control signal.

6. The input sampling structure of claim 5, wherein the third plurality of switches comprises:
   an eleventh switch connected between the common mode voltage and the third capacitor, the first switch is controlled using the $\Phi_1$ control signal;
   a twelfth switch connected between the positive input terminal of the integrator and the third capacitor, the twelfth switch is controlled using the $\Phi_2$ control signal that is approximately 180 degree out of phase relative to the $\Phi_1$ control signal;
   a thirteenth switch connected between the second input signal line and the third capacitor, the thirteenth switch is controlled using the $\Phi_{1D}$ control signal, wherein the $\Phi_{1D}$ control signal is slightly delayed in phase relative to the $\Phi_1$ control signal;
   a fourteenth switch connected between the first reference line and the third capacitor, the fourteenth switch is controlled using the $\Phi_{2D}$. $\overline{B}$ control signal generated by ANDing the $\Phi_{2D}$ signal with the $\overline{B}$ signal, wherein the $\Phi_{2D}$ control signal is slightly delayed in phase relative to the $\Phi_2$ control signal and the $\overline{B}$ signal is the inverse of the B signal; and
   a fifteenth switch connected between the second reference line and the third capacitor, the fifteenth switch is controlled using the $\Phi_{2D}$. B control signal generated by ANDing the $\Phi_{2D}$ signal with the B signal, wherein the $\Phi_{2D}$ control signal is slightly delayed in phase relative to the $\Phi_2$ control signal.

7. The input sampling structure of claim 6, wherein the fourth plurality of switches comprises:
   a sixteenth switch connected between the common mode voltage and the fourth capacitor, the sixteenth switch is controlled using the $\Phi_1$ control signal
   a seventeenth switch connected between the common mode voltage and the fourth capacitor, the seventh switch is controlled using the $\Phi_2$ control signal that is approximately 180 degree out of phase relative to the $\Phi_{1D}$ control signal;
   an eighteenth switch connected between the second buffer and the fourth capacitor, the eighteenth switch is controlled using the $\Phi_{1D}$ control signal, wherein the $\Phi_{1D}$ control signal is slightly delayed in phase relative to the $\Phi_1$ control signal;
   a nineteenth switch connected between the first reference line and the fourth capacitor, the nineteenth switch is controlled the $\Phi_{2D}$. B control signal generated by ANDing the $\Phi_{2D}$ signal with the B signal, wherein the $\Phi_{2D}$ control signal is slightly delayed in phase relative to the $\Phi_2$ control signal; and
   a twentieth switch connected between the second reference line and the fourth capacitor, the twentieth switch is controlled using the $\Phi_{2D}$. $\overline{B}$ control signal generated by ANDing the $\Phi_{2D}$ signal with the $\overline{B}$ signal, wherein the $\Phi_{2D}$ control signal is slightly delayed in phase relative to the $\Phi_2$ control signal and the $\overline{B}$ signal is the inverse of the B signal.

8. The input sampling structure of claim 1, wherein the integrator is an integrator operational amplifier.

9. An analog-to-digital converter (ADC) comprising:
   a digital filter;
   a delta-sigma modulator coupled to the digital filter, the delta-sigma modulator comprising:
      a main input sampling structure comprising:
         an integrator having a positive input terminal and a negative input terminal;
         a first capacitor; and
         a first plurality of switches for selectively connecting the first capacitor to a common mode voltage, the negative input terminal, a first input signal line, a first reference line, and a second reference line; and
      a first replica input sampling structure coupled to the main input sampling structure, the first replica input sampling structure comprising:
         a first buffer connected to the first input signal line, the first buffer reducing the signal dependent current from the first input signal thereby reducing gain error;
         a second capacitor; and
         a second plurality of switches for selectively connecting the second capacitor to the common mode voltage, the first buffer, and the first and second reference lines such that a signal-dependent current that is drawn from the reference signal lines is cancelled in the main input sampler.

10. The ADC of claim 9, wherein the main input sampling structure further comprises:
    a third capacitor; and
    a third plurality of switches selectively connecting the third capacitor to a common mode voltage, the positive input terminal, a second input signal line, the first reference line, and the second reference line.

11. The ADC of claim 10 further comprises:
    a second replica input sampling structure coupled to the main input sampling structure, the second replica input sampling structure comprising:
       a second buffer connected to the second input signal line, the second buffer reducing the signal dependent current from the second input signal thereby reducing gain error;
       a fourth capacitor;
       a fourth plurality of switches selectively connecting the second capacitor to the common mode voltage, the second buffer, and the first and second reference lines such that a signal-dependent current that is drawn from the reference signal lines is cancelled in the main input sampler.

12. The ADC of claim 11, wherein the first plurality of switches comprises:
    a first switch connected between the common mode voltage and the first capacitor, the first switch is controlled using a $\Phi_1$ control signal;
    a second switch connected between the negative input terminal of the integrator and the first capacitor, the second switch is controlled using a $\Phi_2$ control signal that is approximately 180 degree out of phase relative to the $\Phi_1$ control signal;
    a third switch connected between the first input signal line and the first capacitor, the third switch is controlled using a $\Phi_{1D}$ control signal, wherein the $\Phi_{1D}$ control signal is slightly delayed in phase relative to the $\Phi_1$ control signal;
    a fourth switch connected between the first reference line and the first capacitor, the fourth switch is controlled using a $\Phi_{2D}$. B control signal generated by ANDing the $\Phi_{2D}$ signal with a B signal, wherein the $\Phi_{2D}$ control signal is slightly delayed in phase relative to the $\Phi_2$ control signal and the B signal is an output from the delta-sigma modulator; and
    a fifth switch connected between the second reference line and the first capacitor, the fifth switch is controlled using a $\Phi_{2D} \cdot \overline{B}$ control signal generated by ANDing the $\Phi_{2D}$ signal with a $\overline{B}$ signal, wherein the $\Phi_{2D}$ control signal is slightly delayed in phase relative to the $\Phi_2$ control signal and the $\overline{B}$ signal is the inverse of the B signal.

13. The ADC of claim 12, wherein the second plurality of switches comprises:

a sixth switch connected between the common mode voltage and the second capacitor, the sixth switch is controlled using the $\Phi_1$ control signal;

a seventh switch connected between the common mode voltage and the second capacitor, the seventh switch is controlled using the $\Phi_2$ control signal that is approximately 180 degree out of phase relative to the $\Phi_1$ control signal;

an eighth switch connected between the first buffer and the second capacitor, the eighth switch is controlled using the $\Phi_{1D}$ control signal, wherein the $\Phi_{1D}$ control signal is slightly delayed in phase relative to the $\Phi_1$ control signal;

a ninth switch connected between the first reference line and the second capacitor, the ninth switch is controlled using the $\Phi_{2D} \cdot \overline{B}$ control signal generated by ANDing the $\Phi_{2D}$ signal with the $\overline{B}$ signal, wherein the $\Phi_{2D}$ control signal is slightly delayed in phase relative to the $\Phi_2$ control signal and the $\overline{B}$ signal is the inverse of the B signal; and a tenth switch connected between the second reference line and the second capacitor, the tenth switch is controlled using the $\Phi_{2D} \cdot B$ control signal generated by ANDing the $\Phi_{2D}$ signal with the B signal, wherein the $\Phi_{2D}$ control signal is slightly delayed in phase relative to the $\Phi_2$ control signal and the B signal is an output from the delta-sigma modulator.

14. The ADC of claim 13, wherein the third plurality of switches comprises:

an eleventh switch connected between the common mode voltage and the third capacitor, the first switch is controlled using the $\Phi_1$ control signal;

a twelfth switch connected between the positive input terminal of the integrator and the third capacitor, the twelfth switch is controlled using the $\Phi_2$ control signal that is approximately 180 degree out of phase relative to the $\Phi_1$ control signal;

a thirteenth switch connected between the second input signal line and the third capacitor, the thirteenth switch is controlled using the $\Phi_{1D}$ control signal, wherein the $\Phi_{1D}$ control signal is slightly delayed in phase relative to the $\Phi_1$ control signal;

a fourteenth switch connected between the first reference line and the third capacitor, the fourteenth switch is controlled using the $\Phi_{2D} \cdot \overline{B}$ control signal generated by ANDing the $\Phi_{2D}$ signal with the $\overline{B}$ signal, wherein the $\Phi_{2D}$ control signal is slightly delayed in phase relative to the $\Phi_2$ control signal and the $\overline{B}$ signal is the inverse of the B signal; and a fifteenth switch connected between the second reference line and the third capacitor, the fifteenth switch is controlled using the $\Phi_{2D} \cdot B$ control signal generated by ANDing the $\Phi_{2D}$ signal with the B signal, wherein the $\Phi_{2D}$ control signal is slightly delayed in phase relative to the $\Phi_2$ control signal and the B signal is an output from the delta-sigma modulator.

15. The ADC of claim 14, wherein the fourth plurality of switches comprises:

a sixteenth switch connected between the common mode voltage and the fourth capacitor, the sixteenth switch is controlled using the $\Phi_1$ control signal a seventeenth switch connected between the common mode voltage and the fourth capacitor, the seventh switch is controlled using the $\Phi_2$ control signal that is approximately 180 degree out of phase relative to the $\Phi_1$ control signal;

an eighteenth switch connected between the second buffer and the fourth capacitor, the eighteenth switch is controlled using the $\Phi_{1D}$ control signal, wherein the $\Phi_{1D}$ control signal is slightly delayed in phase relative to the $\Phi_1$ control signal;

a nineteenth switch connected between the first reference line and the fourth capacitor, the nineteenth switch is controlled the $\Phi_{2D} \cdot B$ control signal generated by ANDing the $\Phi_{2D}$ signal with the B signal, wherein the $\Phi_{2D}$ control signal is slightly delayed in phase relative to the $\Phi_2$ control signal and the B signal is an output from the delta-sigma modulator; and a twentieth switch connected between the second reference line and the fourth capacitor, the twentieth switch is controlled using the $\Phi_{2D} \cdot \overline{B}$ control signal generated by ANDing the $\Phi_{2D}$ signal with the $\overline{B}$ signal, wherein the $\Phi_{2D}$ control signal is slightly delayed in phase relative to the $\Phi_2$ control signal and the $\overline{B}$ signal is the inverse of the B signal.

16. The ADC of claim 9, wherein the integrator is an integrator operational amplifier.

17. A method for reducing distortion and gain errors in an input sampling circuit having a main input sampling structure comprising an integrator having a positive input terminal and a negative input terminal, a first capacitor, and a first plurality of switches for selectively connecting the first capacitor to a common mode voltage, the negative input terminal, a first input signal line, a first reference line, and a second reference line, the method comprising:

coupling a first replica input sampling structure to the main input sampling structure, the first replica input sampling structure comprising a first buffer, a second capacitor, and a second plurality of switches for selectively connecting the second capacitor to the common mode voltage, the first buffer, and the first and second reference lines;

buffering the first input signal line using the first buffer to reduce signal dependent current from the first input signal line; and controlling connections of the first and second reference signal lines to the second capacitor in the first replica input sampling structure such that a signal-dependent current that is drawn from the reference signal lines is cancelled in the main input sampler.

18. The method of claim 17, wherein the main input sampling structure further comprising a third capacitor and a third plurality of switches selectively connecting the third capacitor to a common mode voltage, the positive input terminal, a second input signal line, the first reference line, and the second reference line, the method further comprising the steps of:

coupling a second replica input sampling structure to the main input sampling structure, the replica input sampling structure comprising a second buffer, a fourth capacitor, and a fourth plurality of switches for selectively connecting the fourth capacitor to the common mode voltage, the second buffer, and the first and second reference lines;

buffering the second input signal line using the second buffer to reduce signal dependent current from the second input signal line; and controlling connections of the first and second reference signal lines to the fourth capacitor in the second replica input sampling structure such that a signal-dependent current that is drawn from the reference signal lines is cancelled in the main input sampler.

* * * * *